United States Patent
Seo et al.

(10) Patent No.: US 6,753,693 B2
(45) Date of Patent: Jun. 22, 2004

(54) TEST APPARATUSES FOR SEMICONDUCTOR INTEGRATED CIRCUITS

(75) Inventors: Ki-Myung Seo, Kyunggi-do (KR);
Jae-Kuk Jeon, Kyunggi-do (KR);
Do-Hoon Byun, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/247,534

(22) Filed: Sep. 20, 2002

(65) Prior Publication Data

US 2003/0102882 A1 Jun. 5, 2003

(30) Foreign Application Priority Data

Dec. 3, 2001 (KR) ........................................ 2001-75868

(51) Int. Cl.⁷ .............................................. G01R 31/26
(52) U.S. Cl. .................. 324/765; 324/73.1; 324/158.1; 702/118
(58) Field of Search ................................ 324/73.1, 763, 324/764, 765, 158.1; 702/89, 118–119, 124–126; 714/700, 718, 724, 728, 731, 736, 738

(56) References Cited

U.S. PATENT DOCUMENTS

| | | | | |
|---|---|---|---|---|
| 4,928,278 A | * | 5/1990 | Otsuji et al. | 714/700 |
| 5,432,797 A | * | 7/1995 | Takano | 714/718 |
| 5,461,310 A | * | 10/1995 | Cheung et al. | 324/158.1 |
| 5,794,175 A | * | 8/1998 | Conner | 702/119 |

FOREIGN PATENT DOCUMENTS

| | | |
|---|---|---|
| JP | 11-311661 | 11/1999 |
| KR | 1999-62211 | 7/1999 |
| KR | 1999-0062211 | 7/1999 |
| KR | 2000-17238 | 3/2000 |

* cited by examiner

*Primary Examiner*—Minh N. Tang
(74) *Attorney, Agent, or Firm*—Harness Dickey

(57) ABSTRACT

A test apparatus simultaneously tests a plurality of semiconductor integrated circuits according to test data stored in a single memory set. A sub-test data generator includes a plurality of data reproduction units, each of which corresponds to one of the integrated circuits being tested. Each data reproduction unit reproduces the stored test data into a reproduced test data set, which is then processed by a driver, and sent to the corresponding integrated circuit for testing.

17 Claims, 2 Drawing Sheets

TEST APPARATUSES FOR SEMICONDUCTOR INTEGRATED CIRCUITS

RELATED APPLICATION

This application claims the benefit of priority under 35 U.S.C. §119(a) of Korean Patent Application No. 2001-75868, filed on Dec. 3, 2001, the contents of which are herein incorporated by reference in their entirety.

FIELD OF THE INVENTION

The present invention relates to an apparatus for testing semiconductor integrated circuits and, more particularly, to an apparatus for simultaneously testing a plurality of semiconductor integrated circuits.

BACKGROUND OF THE INVENTION

Generally, a process for fabricating semiconductor integrated circuits comprises steps for testing whether the semiconductor integrated circuit operates properly, and for detecting which portions are not operating correctly.

Test apparatuses for testing steps can typically be categorized as either single test apparatuses or parallel test apparatuses. The single test apparatuses can test only one semiconductor integrated circuit at a time, while the parallel test apparatuses can test a plurality of semiconductor integrated circuits at the same time. Therefore, the parallel test apparatuses can be very useful for production of integrated circuits on a large scale. Such parallel test apparatuses are found in Korean Patent Publication No. 1999-62211 entitled "TEST SYSTEM FOR SEMICONDUCTOR DEVICE," and Korean Patent Publication No. 2000-17238 entitled "TEST APPARATUS OF SEMICONDUCTOR INTEGRATED CIRCUIT AND METHOD FOR CONTROLLING THE SAME."

FIG. 1 illustrates an example of a parallel test apparatus.

Referring to FIG. 1, the test apparatus 1 comprises memory sets MS0–MSn that correspond to Integrated circuits DUT0_DUTn being tested, and store test data T_DATA0–T_DATAn for testing the corresponding integrated circuits DUT0_DUTn. A driving circuit 30 transfers the test data T_DATA0–T_DATAn output from the memory sets MS0–MSn to input terminals IN0–1N3 of each of the integrated circuits DUT0–DUTn. A timing controller 50 controls the driving circuit 30. Also, the test apparatus 1 comprises a wave generator 60, an analog unit 70, and comparators C0–Cn. The wave generator 60 and analog unit 70 are described in detail below. The comparators C0–Cn correspond to the integrated circuits DUT0–DUTh. The comparators C0–Cn compare signals, which are output from output terminals OUT0–OUT3 of the integrated circuits DUT0_DUTn, with pre-set expected values (expected data), and generate comparison result signals. A controller 10 controls components of the test apparatus 1. In the test apparatus 1 illustrated in FIG. 1, the tested integrated circuits DUT0–DUTn each has four input terminals IN0–IN3 as well as four output terminals OUT0–OUT3.

Each of the memory sets MS0–MSn includes four memory units M0–M3, which correspond to the input terminals IN0–IN3 included in each of the corresponding integrated circuits DUT0–DUTn. Each of the memories M0–M3 stores the test data T_DATA0–T_DATAn, which will be input to the input terminals IN0–IN3 of the corresponding integrated circuit.

The driving circuit 30 includes sub driving circuits SD0–SDn that correspond to the integrated circuits DUT0–DUTn. Each of the sub driving circuits SD0–SDn includes drivers D0–D3 that correspond to the input terminals IN0–IN3 of the corresponding integrated circuit.

The foregoing conventional test apparatus 1 operates as follows. The test data T_DATA0–T_DATAn, which are stored in the memories M0–M3 of each of the memory sets MS0–MSn, are output from the respective memories M0–M3 in response to a control signal of the controller 10.

The test data T_DATA0–T_DATAn are transferred from the memory sets MS0–MSn to the sub-driving circuits SD0–SDn, respectively. Namely, the test data T-DATA0 Is transferred from the memory set MS0 to the sub-driving circuit SD0; the test data T-DATA1 is transferred from the memory set MS1 to the sub driving circuit SD1; and the test data T-DATAn Is transferred from the memory set MSn to the sub driving circuit SDn. In response to control signals of the timing controller 50, the wave generator 60, and the analog unit 70, the sub driving circuits SD0–SDn transfer the test data T_ATA0–T_DATAn, which are input from the memory sets MS0–MSn, to the Input terminals IN0–IN3 of the integrated circuits DUT0–DUTn being tested.

The timing controller 50 controls the timings of signals output from the drivers D0–D3 in the sub-driving circuits SD0–SDn. The wave generator 60 sets the waveforms of signals output from the drivers D0–D3 in the sub-driving circuits SD0–SDn. The analog unit 70 sets the voltage levels of signals output from the drivers D0–D3, which are included in the sub-driving circuits SD0–SDn, respectively, and also sets expected values for the comparators C0–Cn.

Each of the integrated circuits under test DUT0–DUTn receives the test data T_DATA0–T_DATAn output from the corresponding sub driving circuits SD0–SDn, and generates output signals at the output terminals OUT0–OUT3 in response to the received test data T_DATA0–T_DATAn.

Each of the comparators C1–Cn compares signals, which are generated at the output terminals OUT0–OUT3 of the corresponding integrated circuits DUT0–DUTn, with the expected values, and generates comparison result signals. For example, when the output signals, which are generated at the output terminals OUT0–OUT3 of the integrated circuits DUT0–DUTn, are equal to the reference values (i.e., the corresponding integrated circuits DUT0–DUTn are operating properly), the comparison result signals are low-level. By comparison, when the output signals, which are generated at the output terminals OUT0–OUT3 of the integrated circuits DUT0–DUTn, are not equal to reference values (i.e., the corresponding integrated circuits DUT0–DUTn are not operating properly), the comparison result signals are high-level.

Generally, integrated circuits, which are simultaneously tested in the test apparatus 1, have the same circuit configuration and the same input/output terminals. Therefore, the same test data T_DATA0–T_DATAn may be used to test whether each of the integrated circuits is operating properly. However, the conventional test apparatus 1 illustrated in FIG. 1 has a separate memory set MS0, MS1, . . . , MSn for each of the integrated circuits DUT0–DUTn being tested. Such a test apparatus 1 needs the same number of memory sets as integrated circuits being tested. The additional memory sets cause an increase in size of the test apparatus 1, and may increase fabrication costs of the test apparatus 1. Furthermore, as the number of memory sets increases, the controller 10 requires an increased controlling time to read data stored in the memories M0–M3 of the memory sets MS0–MSn, i.e., the pattern loading time increases.

SUMMARY OF THE INVENTION

The present invention is directed to a test apparatus, which simultaneously tests multiple semiconductor integrated circuits by applying stored test data to each integrated circuit. The test apparatus includes a set of memory units, each of which stores data used for testing a particular input terminal of each integrated circuit. The test apparatus generates test data for each of the integrated circuits by reproducing the data stored in each of the memory units. Accordingly, the test apparatus need only include a number of memory units equal to the number of input terminals to be tested for each integrated circuit. For example, if four input terminals are being tested for each integrated circuit, only four memory units are required.

The test apparatus includes a sub-test data generator for reproducing the test data stored in the set of memory units in order to generate a reproduced test data set (i.e., sub-test data) for each integrated circuit being tested. Specifically, the sub-test data generator includes one data reproduction unit for each integrated circuit. Each data reproduction unit includes a set of buffers, each of which is connected to a memory unit. The test data stored in each memory unit is transferred to the corresponding buffer in each of the data reproduction units. Each buffer, in turn, transfers the data to a connected driver, which converts the data into an input signal having adequate voltage levels for the integrated circuits. The input signal is then transferred from each driver to a connected input terminal of one of the integrated circuits.

According to the present invention, only one set of memory units to store the test data required for simultaneously testing a plurality of semiconductor integrated circuits. Therefore, the test apparatus of the present invention can be manufactured at a reduced cost compared with a conventional test apparatus, which includes one set of memory units for each integrated circuit being tested.

BRIEF DESCRIPTION OF THE DRAWINGS

The above and other features and advantages of the present invention will become readily apparent from the description that follows, with reference to the accompanying drawings, in which.

DESCRIPTION OF THE PREFERRED EMBODIMENT

The present invention will now be more fully described hereinafter with reference to the accompanying FIG. 2, in which an exemplary embodiment of the invention is shown.

Figure 1:
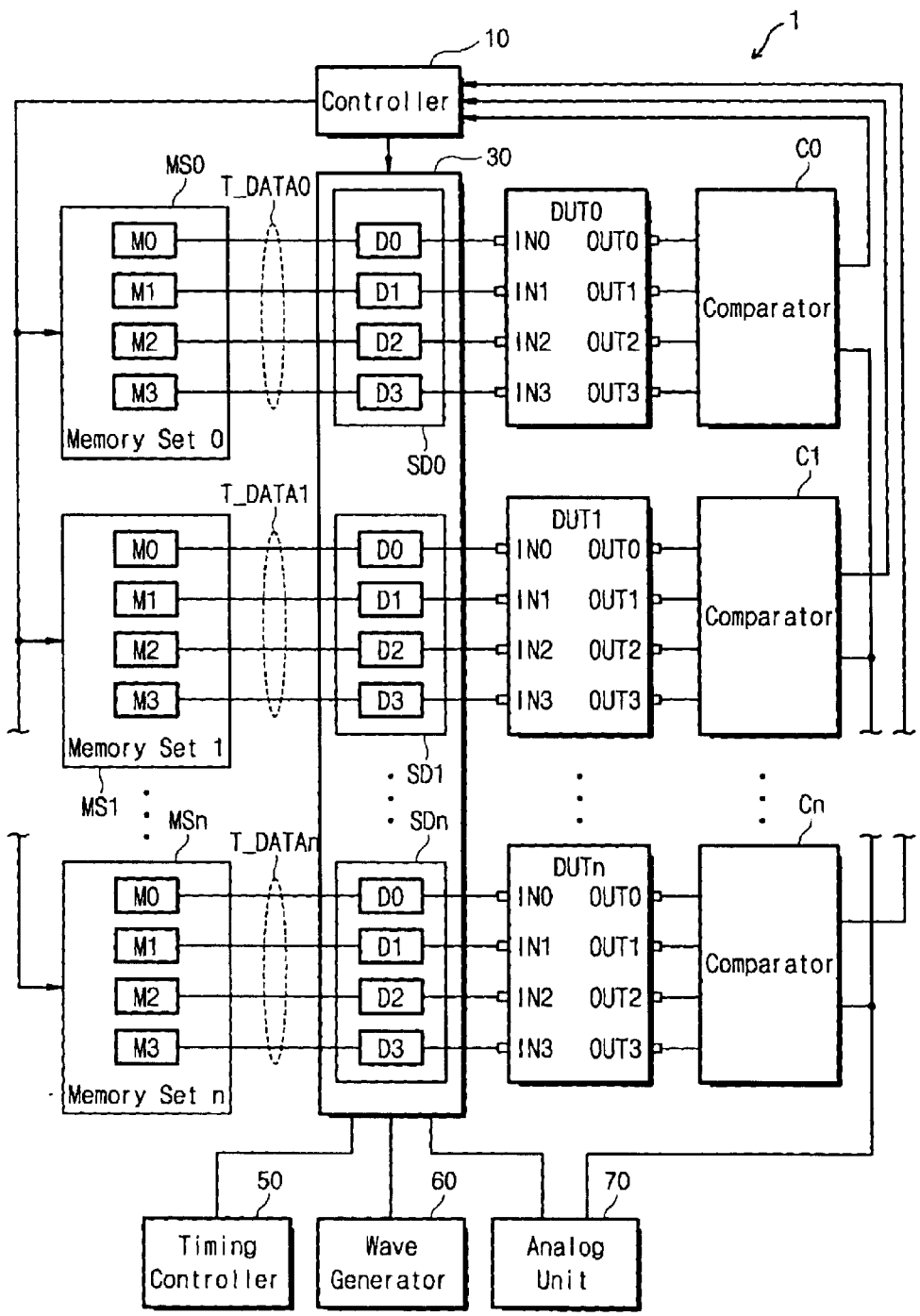
FIG. 1 is a block diagram illustrating an example of a conventional test apparatus.
Figure 2:
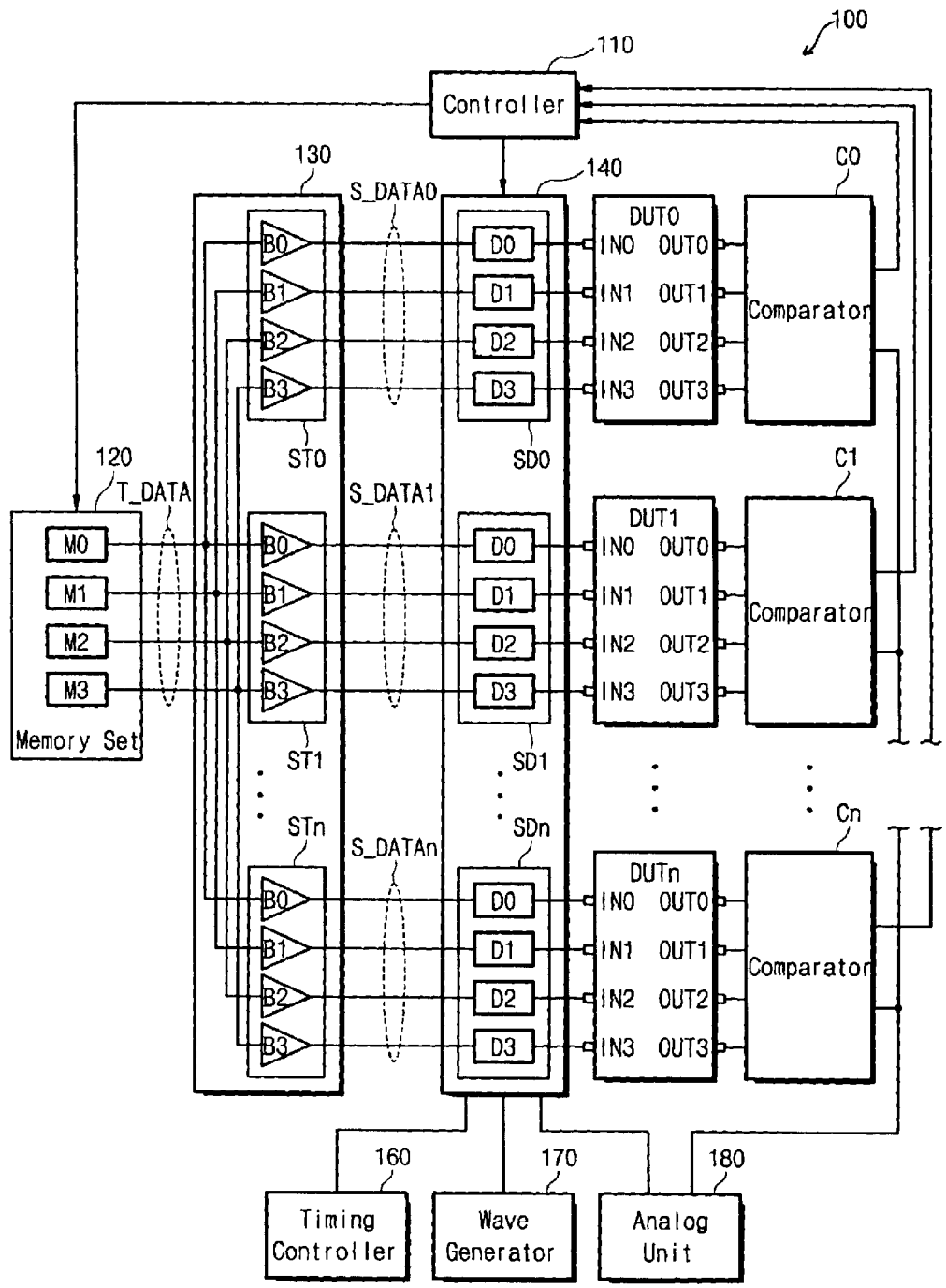
FIG. 2 is a block diagram illustrating a configuration of a test apparatus for testing semiconductor integrated circuits according to an exemplary embodiment of the present invention.

FIG. 2 is a diagram showing a configuration of a test apparatus for semiconductor integrated circuits according to an exemplary embodiment of the present invention. Referring to FIG. 2, the test apparatus 100 of the present invention comprises a controller 110 for performing overall control with respect to the test apparatus 100 as well as a single memory set 120, or test data memory, for storing test data T_DATA. A sub test data generator 130 receives the test data T_DATA output from the memory set 120. The sub-test data generator 130 generates sub-test data sets S_DATA0–S_DATAn by reproducing the original test data set T_DATA as each sub-test data set S_DATA0–S_DATAn. Therefore, the sub-test data generator 130 may also be referred to as a test data reproduction device, and the sub-test data sets S_DATA0–S_DATAn can be referred to as reproduced test data sets. A driving circuit 140 receives the sub-test data S_DATA0–S_DATAn from the sub test data generator 130. Then, the driving circuit 140 converts the sub-test data S_DATA0–S_DATAn to signals adequate for transferring to input terminals IN0–IN3 of integrated circuits DUT0–DUTn being tested. Comparators C0–Cn compare the signals, which are output from the output terminals OUT0–OUT3 of the tested integrated circuits DUT0–DUTn, with reference data (expected data), and generate comparison result signals. A timing controller 160 controls the driving circuit 140. Also, the test apparatus 100 further comprises a wave generator 170 and an analog unit 180 described in detail below. For the purposes of illustration only, each of the integrated circuits DUT0–DUTn will be assumed to include four input terminals IN0–IN3 as well as four output terminals OUT0–OUT3.

Configurations and operations of the foregoing components of the test apparatus 100 will now be described more fully hereinafter. The memory set 120 includes four memories M0–M3, the number of which is equal to that of the input terminals belonging to one of the integrated circuits DUT0–DUTn. Each of the memory units M0–M3 stores test data (or a test pattern) that will be transferred to the input terminal corresponding to each of the integrated circuits DUT0–DUTn. For example, the memory M0 stores data that will be transferred to the same input terminal IN0 of each of the integrated circuits DUT0–DUTn; the memory M1 stores data that will be transferred to the same input terminal IN1 of each of the integrated circuits DUT0–DUTn; the memory M2 stores data that will be transferred to the same input terminal IN2 of each of the integrated circuits DUT0–DUTn; and the memory M3 stores data that will be transferred to the same input terminal IN3 of each of the integrated circuits DUT0–DUTn. The data stored in the memories M0–M3 are, for example, clock signal information, reset signal information, input/output control signal information, and test data, respectively.

The sub-test data generator (test data reproduction device) 130 comprises a plurality of sub-test data generating units ST0–STn (also referred to as test data reproduction units) that correspond to the integrated circuits DUT0–DUTn. Each of the sub test data generating units ST0–STn reproduces the test data T_DATA output from the memory set 120, to generate the sub test data S_DATA0–S_DATAn. More specifically, each of the sub-test data generating units ST0–STn is formed of four buffers B0–B3, the number of buffers B0–B3 being the same as the number of input terminals belonging to one of the integrated circuits DUT0–DUTn.

Since the sub-test data generating units ST0–STn are connected in parallel, as shown in FIG. 2, each of the sub-test data generating units ST0–STn can reproduce the test data T_DATA simultaneously.

The driving circuit 140 includes sub-driving circuits SD0–SDn that correspond to the integrated circuits DUT0–DUTn, respectively. Each of the sub driving circuits SD0–SDn is formed of drivers D0–D3 that correspond to the input terminals of the corresponding integrated circuit under test.

The comparators C0–Cn correspond to the integrated circuits DUT0–DUTn. The comparators C0–Cn compare the signals output from the output terminals OUT0–OUT3 of the corresponding integrated circuits DUT0–DUT3 with reference values, and generate comparison result signals. The signals output from the comparators C0–Cn are transferred to the controller 110. The controller 110 receives the comparison result signals output from the comparators C0–Cn for determining whether each of the integrated circuits DUT0–DUTn is defective or not. Accordingly, the comparators C0–Cn and the controller 110 collectively form an evaluation device for evaluating the condition of each of the integrated circuits DUT0–DUTn being tested.

The timing controller 160 controls timings of signals output from the drivers D0–D3 in each of the sub driving circuits SD0–SDn. The wave generator 170 sets the waveforms of signals output from the drivers D0–D3 in the sub-driving circuits SD0–SDn. The analog unit 180 sets the voltage levels of signals output from the drivers D0–D3 in the sub driving circuits SD0–SDn, and also sets the expected values of the comparators C0–Cn.

The foregoing test apparatus 100 of the present Invention operates as follows. According to control signals of the controller 110, the test data T_DATA stored In the memories M0_M3 of the memory set 120 are output from the memories M0–M3.

The test data T_DATA, which are generated from the memory set 120, are input to the sub-test data generating units ST0–STn. Each of the sub test data generating units ST0–STn reproduces the test data T_DATA as the sub-test data (reproduced test data sets) S_DATA0–S_DATAn. The sub-test data S_DATA0–S_DATAn, which are output from the sub-test data generating units ST0–STn, respectively, are transferred to the corresponding sub driving circuits SD0–SDn.

In response to control signals of the timing controller 160, the wave generator 170, and the analog unit 180, the sub-driving circuits (also referred to as driving units, or drivers) SD0–SDn convert the sub test data S_DATA0–S_DATAn to input signals adequate for transferring to the input terminals IN0–IN3 of the corresponding integrated circuits DUT0–DUT3. The sub-driving circuits SD0–SDn then transfers the converted sub-test data S_DATA0–S_DATAn (the input signals) to the integrated circuits DUT0–DUTn.

In other words, the test data T_DATA, which are output from the memory set 120, are transferred to the input terminals IN0–IN3 of each of the integrated circuits DUT0–DUTn, through the sub-test data generator 130 and the driving circuit 140.

Each of the integrated circuits DUT0–DUTn, which receives the sub test data S_DATA0–S_DATAn, generates output signals in response to these inputs at the output terminals QUT0–OUT3.

The comparators C0–Cn receive the output signals from the output terminals OUT0–OUT3 of the corresponding integrated circuits DUT0–DUTn. Then, the comparators C0–Cn compare the signals with reference values stored in the comparators C0–Cn, and generate comparison result signals. For instance, when signals output from the output terminals OUT0–OUT3 of the integrated circuit under test are equal to the stored reference values (i.e., the corresponding integrated circuits DUT0–DUTn operate properly), the comparison result signals are low-level. By comparison, when signals output from the output terminals OUT0–OUT3 of the integrated circuit under test are not equal to the stored reference values (i.e., when the corresponding integrated circuits DUT0–DUTn do not operate properly), the comparison result signals are high-level.

The test apparatus 100 of the present invention needs only one memory set, regardless of the number of integrated circuits being tested in parallel (i.e., at the same time). Accordingly, the configuration of the test apparatus 100 of the present invention enables a decrease in fabrication costs of the test apparatus 100, as compared with a conventional test apparatus 1 that requires the same number of memory sets as integrated circuits under test. Besides, a controlling time of the memory set, i.e., a pattern loading time can be reduced to decrease an overall testing time.

While the present invention has been described in connection with a specific and exemplary embodiment thereof, various changes and modifications may be implemented without departing from the spirit and scope of the invention. It should be appreciated that the scope of the invention is not limited to the detailed description of the invention hereinabove, which is intended merely to be illustrative, but rather encompasses the subject matter defined by the following claims.

What is claimed is:

1. An apparatus for testing a plurality of integrated circuits, comprising:

a test data memory for storing a test data set; and a test data reproduction device for reproducing the test data set as a plurality of reproduced data sets to be used for testing the plurality of integrated circuits, wherein the test data reproduction device includes a plurality of test data reproduction units, wherein the plurality of test data reproduction units equals, in number, the plurality of integrated circuits so that there is a one-to-one relationship between a given test data reproduction unit and a given integrated circuit, each test data reproduction unit simultaneously reproducing the test data set as a reproduced data set for a corresponding one of the plurality of integrated circuits.

2. The apparatus of claim 1 further comprising:

a driving device for converting the reproduced data sets into input data sets and sending the input data sets to input terminals of the plurality of integrated circuits, the input data sets having adequate signal levels for the integrated circuits; and an evaluation device for evaluating the integrated circuits based on output signals generated by the integrated circuits in response to receiving input data sets.

3. The apparatus of claim 2, further comprising:

an analog unit for setting the signal levels of the input data sets generated by the driving device.

4. The apparatus of claim 2, wherein the evaluation device includes, one or more comparison units for comparing the generated output signals of each integrated circuit to reference data, and generating comparison result signals based on each comparison; and a controller for evaluating each integrated circuit based on the generated comparison result signals.

5. The apparatus of claim 1, wherein each of the plurality of integrated circuits includes N input terminals, N being a number greater than or equal to one; and the test data memory includes N memory units, each memory unit being configured to store a portion of the test data set for a corresponding input terminal of the integrated circuit.

6. The apparatus of claim 5, wherein each test data reproduction unit includes N buffers, each buffer being configured to hold a portion of the test data set received from a corresponding memory unit, and each test data reproduction unit outputs the reproduced data set by outputting the portion of the test data set held in each buffer.

7. The apparatus of claim 6, further comprising a driving device including,
a plurality of driving units, each driving unit being configured to receive a reproduced data set from a corresponding test data reproduction unit and convert the received reproduced data set into an input data set, the input data set having adequate signal levels for the integrated circuits, the driving device being configured to send the input data set to a corresponding integrated circuit.

8. The apparatus of claim 7, wherein
each driving unit includes N sub-driving units, each sub-driving unit being linked to one of the N buffers, each sub-driving unit being configured to convert the portion of the test data set output from the linked buffer into an input signal, the input data set including the input signals of the N buffers; and wherein
the driving unit sends the input data set to the corresponding integrated circuit by outputting the input signal of each sub-driving circuit to a corresponding input terminal of the integrated circuit.

9. The apparatus of claim 7, further comprising:
a plurality of comparison units, each comparison unit being configured to receive output signals from a corresponding integrated circuit, the comparison unit comparing the received output signals to reference data to generate comparison result signals; and
a controller for evaluating each integrated circuit based on the generated comparison result signals.

10. The apparatus of claim 1, wherein each of the plurality of integrated circuits are tested simultaneously.

11. An apparatus for simultaneously testing M integrated circuits, M being a number greater than one, each integrated circuit including N input terminals, N being a number greater than or equal to one, comprising:
a test data memory set for storing a test data set, the test data memory set including N memory units;
a test data reproduction device for reproducing the test data set as M reproduced data sets to be used for testing the integrated circuits;
a driving device for converting the reproduced data sets into input data sets and sending the input data sets to input terminals of the integrated circuits, the input data sets having adequate signal levels for the integrated circuits so that there is a one-to-one relationship between a given test date reproduction device and a given integrated circuit;
an evaluation device for evaluating the integrated circuits based on output signals generated by the integrated circuits in response to receiving the input data sets,
wherein the test data reproduction device includes M test data reproduction units, each test data reproduction unit simultaneously reproduces the test data set into a reproduced data set for a corresponding one of the M integrated circuits so that there is a one-to-one relationship between a given test data reproduction device and a given integrated circuit.

12. The apparatus of claim 11, wherein each test data reproduction unit includes N buffers, each buffer being configured to hold a portion of the test data set received from a corresponding memory unit; and each test data reproduction unit outputs the reproduced data set by outputting the received portion of the test data set held in each buffer.

13. The apparatus of claim 11, wherein the driving device includes M driving units, each driving unit being configured to receive a reproduced data set from a corresponding test data reproduction unit and to convert the received reproduced data set into an input data set, the input data set having adequate signal levels for the integrated circuits, each driving unit being configured to send the input data set to a corresponding integrated circuit.

14. The apparatus of claim 13, wherein each driving unit includes N sub-driving units, each sub-driving unit being linked to one of the N buffers, each sub-driving unit being configured to convert the portion of the test data set output from the linked buffer into an input signal, the input data set including the input signals of the N buffers; and wherein
the driving unit sends the input data set to the corresponding integrated circuit by outputting the input signal of each sub-driving unit to a corresponding input terminal of the integrated circuit.

15. The apparatus of claim 11 wherein the evaluation device includes,
M comparison units, each comparison unit being configured to receive output signals from a corresponding integrated circuit, the output signals being generated by the integrated circuit in response to receiving the input data set from a corresponding driving unit, the comparison unit comparing the received output signals to reference data to generate comparison result signals, and
a controller for evaluating each integrated circuit based on the generated comparison result signals.

16. An apparatus for testing a plurality of integrated circuits, comprising:
a test data memory for storing a test data set; and
a test data reproduction device for reproducing the test data set as a plurality of reproduced data sets to be used for testing the plurality of integrated circuits,
wherein the test data reproduction device includes a plurality of test data reproduction units,
wherein the plurality of test data reproduction units equals, in number, the plurality of integrated circuits so that there is a one-to-one relationship between a given test data reproduction unit and a given integrated circuit.

17. An apparatus for simultaneously testing M integrated circuits, M being a number greater than one, each integrated circuit including N input terminals, N being a number greater than or equal to one, comprising:
a test data memory set for storing a test data set, the test data memory set including N memory units;
a test data reproduction device including M test data reproduction units, wherein each test data reproduction unit substantially simultaneously reproduces the test data set into a reproduced data set to be used for testing an integrated circuit so that there is a one-to-one relationship between a given test data reproduction device and a given integrated circuit.

* * * * *